(12) United States Patent
Nguyen

(10) Patent No.: US 6,177,182 B1
(45) Date of Patent: Jan. 23, 2001

(54) THERMALLY REACTIVE NEAR INFRARED ABSORPTION POLYMER COATINGS, METHOD OF PREPARING AND METHODS OF USE

(75) Inventor: My T. Nguyen, Kirkland (CA)

(73) Assignee: American Dye Source, Inc., Mount Royal (CA)

(*) Notice: Under 35 U.S.C. 154(b), the term of this patent shall be extended for 0 days.

(21) Appl. No.: 09/561,817

(22) Filed: May 1, 2000

Related U.S. Application Data

(62) Division of application No. 09/275,032, filed on Mar. 18, 1999, now Pat. No. 6,124,425.

(51) Int. Cl.⁷ ............ B32B 27/00; C08G 73/00
(52) U.S. Cl. .................... 428/319.3; 428/424.2; 428/491; 428/511; 428/913; 427/407.1; 427/408; 427/411; 427/316; 427/318; 101/453; 101/463.1; 101/470; 528/422; 528/206; 528/208; 528/210; 528/212; 528/216; 528/218; 528/219; 430/118; 430/126; 430/127
(58) Field of Search ............ 428/319.3, 424.2, 428/491, 511, 913; 427/407.1, 408, 411, 316, 318; 101/453, 463.1, 470; 528/422, 206, 208, 210, 212, 216, 218, 219; 430/118, 126, 127

(56) References Cited

U.S. PATENT DOCUMENTS

| | | |
|---|---|---|
| 3,962,513 | 6/1976 | Eames . |
| 3,964,389 | 6/1976 | Peterson . |
| 4,046,946 | 9/1977 | Shaw . |
| 4,054,094 | 10/1977 | Caddell et al. . |
| 4,081,572 | 3/1978 | Pacansky . |
| 4,245,003 | 1/1981 | Oransky et al. . |
| 4,477,635 | 10/1984 | Mitra . |
| 4,501,876 | 2/1985 | Zahr . |
| 4,508,811 | 4/1985 | Gravesteijn et al. . |
| 4,555,475 | 11/1985 | Gamson et al. . |
| 4,666,819 | 5/1987 | Elmasry . |
| 4,680,375 | 7/1987 | Elmasry . |
| 5,085,972 | 2/1992 | Vogel . |
| 5,262,275 | 11/1993 | Fan . |
| 5,292,556 | 3/1994 | Ma et al. . |
| 5,360,899 | 11/1994 | Nussstein et al. . |
| 5,362,812 | 11/1994 | Holmes et al. . |
| 5,569,573 | 10/1996 | Takahashi et al. . |
| 5,595,854 | 1/1997 | Leenders et al. . |
| 5,665,524 | 9/1997 | Kashio et al. . |
| 5,741,620 | 4/1998 | Holmes et al. . |
| 5,824,768 | 10/1998 | Burns et al. . |

FOREIGN PATENT DOCUMENTS

| | | |
|---|---|---|
| 0 514 145 A1 | 11/1992 | (EP) . |
| 0 615 162 A2 | 9/1994 | (EP) . |
| 0 770 497 A1 | 2/1997 | (EP) . |
| 0 770 494 A1 | 5/1997 | (EP) . |
| 0 770 495 A1 | 5/1997 | (EP) . |
| 0 770 496 A1 | 5/1997 | (EP) . |
| 0 773 112 A1 | 5/1997 | (EP) . |
| 0 773 113 A1 | 5/1997 | (EP) . |
| 0 774 364 A1 | 5/1997 | (EP) . |
| 0 800 928 A1 | 10/1997 | (EP) . |
| 0 867 278 A1 | 9/1998 | (EP) . |
| 1 489 308 | 10/1977 | (GB) . |
| 2 273 366 | 6/1994 | (GB) . |
| 0 652 483 A1 | 5/1995 | (GB) . |
| WO 96/20429 | 7/1996 | (WO) . |
| WO 97/39894 | 10/1997 | (WO) . |

OTHER PUBLICATIONS

U.S. application No. 08/922,714, Persley, filed Sep. 2, 1997.

*Primary Examiner*—Duc Truong
(74) *Attorney, Agent, or Firm*—Goudreau Gage Dubuc

(57) ABSTRACT

Provided herein are novel polymeric coating materials for direct digital imaging by laser. More specifically the novel coating materials are thermally reactive near infrared absorption polymers designed for use with near infrared laser imaging devices. This invention further extends to the preparation and methods of use of the novel materials. The invention is particularly useful in the preparation of lithographic printing plates for computer-to-plate and digital-offset-press technologies. The invention extends to photoresist applications, to rapid prototyping of printed circuit boards and to chemical sensor development.

12 Claims, No Drawings

THERMALLY REACTIVE NEAR INFRARED ABSORPTION POLYMER COATINGS, METHOD OF PREPARING AND METHODS OF USE

STATEMENT OF RELATED APPLICATION

This application is a divisional of application Ser. No. 09/275,032 filed Mar. 18, 1999, now U.S. Pat. No. 6,124,425.

FIELD OF THE INVENTION

This invention relates to novel coating materials for direct digital imaging by laser. More specifically the novel coating materials are thermally reactive near infrared absorption polymers designed for use with near infrared laser imaging devices. This invention further extends to the preparation and methods of use of the novel materials. The invention is particularly useful in the preparation of lithographic printing plates for computer-to-plate and digital-offset-press technologies. The invention extends to photoresist applications, to rapid prototyping of printed circuit boards and to chemical sensor development.

BACKGROUND OF THE INVENTION

The printing and graphic arts industries require printing plates coated with substances which are suitable for direct digital imaging by laser. The graphic image stored and created on computers can be output to a near infrared laser digital imaging device which will "draw" the image on the printing plate coating by eliciting a localized transformation of the coating. This method has the distinct advantage of not requiring a wet development step. The printing plate can act as a positive or a negative depending on the laser effect on the coating.

In the case of the present invention, the coating is oleophilic (attracts ink) and the undercoating is hydrophilic. Depending on where the laser image is drawn on the coating, the printing plate may be made to act as a positive or negative plate. Indeed, exposure to laser radiation renders the coating locally hydrophilic which causes it to wash away with water based inks and fountain solutions.

Various near infrared absorption polymers have been proposed in the prior art. However, these polymers face the various drawbacks outlined below.

U.S. Pat. No. 5,362,812 discloses reactive polymeric dyes comprising an azlactone moiety for use in photoresist systems and color proofing media. These materials contain visible light absorption chromophoric moiety and acrylate functional groups, which undergo cross-linking reactions via free radical initiating upon exposure to ultraviolet light. However, these materials cannot be used for lithographic printing plate due to an absence of absorption in the near infrared region.

U.S. Pat. No. 4,666,819 and 4,680,375 teach the preparation of polymers containing cyanine dyes in the polymer backbone for optical recording. These materials are sufficiently stable so as not to be chemically changed upon exposure to near infrared laser light and are not useful in lithographic printing.

U.S. Pat. No. 5,824,768 also teaches to the preparation of polymeric dyes for optical recording. More particularly these dyes are used as coatings in recordable CDs. These materials do not undergo chemical changes upon exposure to near infrared laser light and are not useful.

EP 0652483A1 teaches the preparation of lithographic printing plates, which by virtue of a coating composition can be imaged by near infrared laser light and which do not require wet chemical development. The coating composition contains near infrared absorption dyes, thermal acid generators and polymers having pendant hydrophobic groups such as t-alkyl carboxylates, t-alkyl carbonates, benzyl carboxylates and alkoxyalkyl esters. Upon exposure to near infrared laser light, the exposed area becomes hydrophilic, therefore repelling water based inks. The unexposed areas remain hydrophobic and become the image areas. This type of coating composition however requires high laser power to image and is sensitive to handling.

U.S. Pat. No. 5,569,573 also teaches the preparation of lithographic printing plates, which can be imaged with near infrared laser light and do not require wet chemical development. The laser imaging layer comprises microencapsulated oleophilic materials in hydrophilic binder resins capable of forming a three dimensional network with the microcapsulated oleophilic materials upon exposure to near infrared laser light to becomes image area. This type of coating is difficult to prepare and requires high laser power to achieve imaging.

EP 0 770 495 A1 teaches to prepare lithographic printing plates, which can be imaged with near infrared laser light. The unexposed areas are removed on press with ink and fountain solution. The imaging layer comprises near infrared absorption materials, polymer binders and thermoplastic particles capable of coalescing under heat. This type of coating offers poor substrate adhesion and consequently fail to provide sufficient run length on press.

Thus there remains a need for new polymer coating compositions which overcome the drawbacks of the prior art coatings. The goals are to achieve coating compositions combining the advantages of long-life printing plates, absence of phase separation of the different ingredients in the coating formulation, easily manufactured and inexpensive coating formulations, precisely imagable coatings providing high image resolutions.

SUMMARY OF THE INVENTION

The present invention relates to the preparation of thermally reactive near infrared absorption polymers and to their use in lithographic printing plates for computer-to-plate and digital-offset-press technologies. More particularly, this invention relates to thermally reactive near infrared absorption polymers having repeating units according to Formula I:

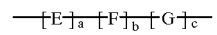

Wherein
E represents the near infrared absorption segment, which exhibits strong absorption bands between 780 and 1200 nm.
F represents the processing segment, which provides excellent film forming properties and solubility in aqueous solutions having pH between 2.0 and 14.0

G represents the thermally reactive segment, which undergoes chemical or physical reactions with or without catalysts upon exposure to near infrared laser light.

a, b and c represent the molar ratios, which vary from 0.01 to 1.00 and wherein the molecular weight is greater than about 5,000.

The present invention also relates to the use of thermally reactive near infrared absorption polymers for making lithographic printing plates, which can be digitally imaged with solid state diode lasers and do not require wet chemical developing process. More particularly, the lithographic printing plates of the present invention comprise an imaging layer containing thermally reactive near infrared absorption polymers of the present invention, optional binder resins and film forming additives applied to a heat insulating hydrophilic layer coated on any suitable substrate such as papers, plastics or aluminum.

Other objects and further scope of applicability of the present invention will become apparent from the detailed description given hereinafter. It should be understood, however, that this detailed description, while indicating preferred embodiments of the invention, is given by way of illustration only, since various changes and modifications within the spirit and scope of the invention will become apparent to those skilled in the art.

DETAILED DESCRIPTION OF THE INVENTION

The thermally reactive near infrared absorption polymers of this present invention may be described accordingly to Formula II to V:

Formula II

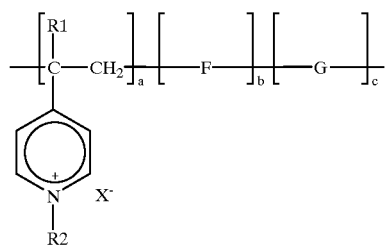

Formula III

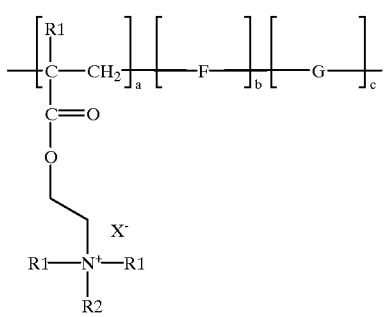

Forumla IV

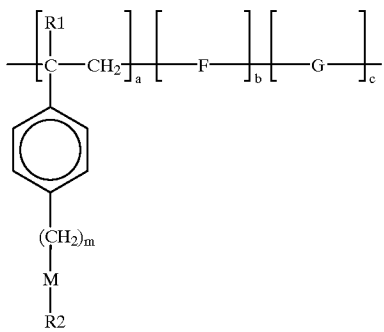

Formula V

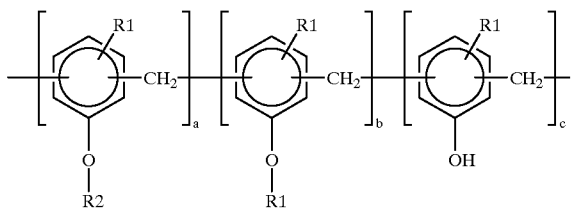

Wherein

F represents a processing unit, which is selected from alkyl acrylate, alkyl methacrylate, hydroxy alkyl acrylate, hydroxy alkyl methacrylate, methyl acrylic acid, methyl methacrylic acid, hydroxy phenyl, hydroxy styrene, sulfoalkyl acrylic acid, sulfoalkyl methacrylic acid, sulfoalkyl acrylic acid metal salts, sulfoalkyl methacrylic acid metal salts, vinyl pyridine, vinyl alkyl pyridium salts, dialkylamino acrylate, and dialkylamino methacrylate.

G represents a thermally reactive unit, which is selected from hydroxy akyl acryalate, hydroxy alkyl methacrylate, hydroxy styrene, amino styrene, N-alkoxymethyl acrylamide, N-alkoxymethyl methacrylamide, glycidyl alkyl acrylate, and glycidyl alkyl methacrylate.

X represents an anionic counter ion selected from bromide, chloride, iodide, tosylate, triflate, trifluoromethane carbonate, dodecyl benzosylfonate and tetrafluoroborate.

M represents oxygen, sulfur, dialkyl amine.

m represents number of repeating units which varies from 0 to 5.

R1 is hydrogen or alkyl with 1 to 18 carbon atoms.

R2 is near infrared absorption chromophoric moiety comprising derivatives of indole, benz[e]indole, benz[cd] indole, benzothiazole, napthothiazole, benzoxazole, napthoxazole, benzselenazole, and napthoselenazole, which can be represented according to Formula VI:

Formula VI

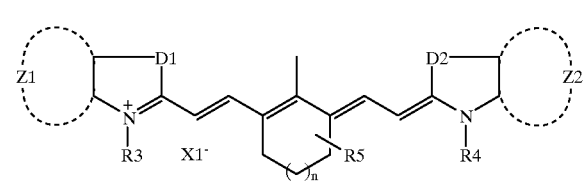

Wherein

Z1 and Z2 represent sufficient atoms to form a fused substituted or unsubstituted aromatic rings, such as phenyl and naphthyl.

D1 and D2 represent —O—, —S—, —Se—, —CH=CH—, and —C(CH$_3$)$_2$—

R3 and R4 represent alkyl, aryl alkyl, hydroxy alkyl, amino alkyl, carboxy alkyl, sulfo alkyl.

R5 represents alkyl and aryl substitution.

X1 represents an anionic counter ion selected from bromide, chloride, iodide, tosylate, triflate, trifluoromethane carbonate, dodecyl benzosylfonate and tetrafluoroborate.

n represents 0 or 1.

SYNTHESES OF NEAR INFRARED ABSORPTION DYES

The synthesis of polymeric precursors and thermally reactive near infrared absorption polymers were performed in a 3 necks glass reactor equipped with water condenser, magnetic stirrer, dropping funnel and nitrogen gas inlet. The molecular structures of thermally reactive near infrared absorption polymers were determined by proton NMR and FTIR spectroscopic techniques. The average molecular weight of the obtained materials was determined by size exclusion chromatography (SEC) using N,N-dimethylformamide solution and calibrated with polystyrene standards.

EXAMPLE 1

Synthesis of Thermally Reactive Near Infrared Absorption Polymer ADS830PO

Poly(4-vinylpyridine-co-N-methoxymethylmethacrylamide) copolymer with 0.2 molar ratio of 4-vinylpyrridine and 0.8 molar ratio of N-methoxymethyl methacrylamide was synthesized by free radical polymerization. The synthesis was carried out by slowly dropping 100 parts of 2-methoxyethanol solution containing 7.5 parts of VAZO64 (a free radical initiator, available from Dupont) and 3 drops dodecyl mercaptan charge transfer agent (available from Aldrich Chemicals) into 320 parts of 2-methoxyethanol solution dissolving with 149.7 parts of N-methoxyethylmethacrylamide (available from Bayer), 30.3 parts of 4-vinyl pyridine at 70° C. under constant stirring and nitrogen atmosphere. The reaction was continued for 10 hours to produce a viscous polymeric solution having 30 percent solid weight. The average molecular weight and molecular weight distribution of the obtained poly(4-vinylpyridine-co-N-methoxymethyl methacrylamide) copolymer were determined to be 43,000 and 2.7, respectively.

The thermally reactive near infrared absorption polymers ADS830PO was synthesized by slowly adding 410 parts of 2-methoxyethanol solution containing 90 parts of 2-[2-[2-choloro-3-[2-(1,3-dihydro-1,1,3-trimethyl-2H-benz[e] indol-2-ylidene) ethylidene]-1-cyclo hexene-1-yl]ethenyl]-1,1,3-trimethyl-1H-benz[e]indolium chloride (available from American Dye Source, Inc.) into 600 parts of poly(4-vinylpyridine-co-N-methoxymethylmethacrylamide) copolymer solution. The reaction was carried out at 40° C. under nitrogen atmosphere and constant stirring for 20 hours to produce a viscous dark green polymeric solution. The thin film of ADS830PO on a glass slide shows a broad absorption band having a maximum at 829 nm.

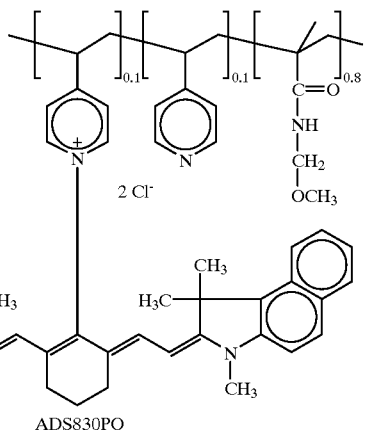

ADS830PO

EXAMPLE 2

Synthesis of Thermally Reactive Near Infrared Absorption Polymer ADS828PO

Thermally reactive near infrared absorption polymer ADS828PO was synthesized by slowly adding 400 parts of 2-methoxyethanol solution containing 100 parts of 2-[2-[2-choloro-3-[2-(1,3-dihydro-1-(2-hydroxyethyl)-3,3-dimethyl-2H-benz[e]indol-2-ylidene) ethylidene]-1-cyclohexene-1-yl]ethenyl]-1-(2-hydroxyethyl)-3,3-dimethyl-1H-benz[e] indolium chloride (available from American Dye Source, Inc.) into 600 parts of poly(4-vinylpyrridine-co-N-methoxymethylmethacrylamide) copolymer solution, which was synthesized similarly to Example 1, at 40° C. under nitrogen atmosphere and constant stirring. The mixture was continued for 20 hours to produce a viscous dark green solution. The thin film of AD5828PO on glass slide shows a broad absorption band having a maximum at 828 nm.

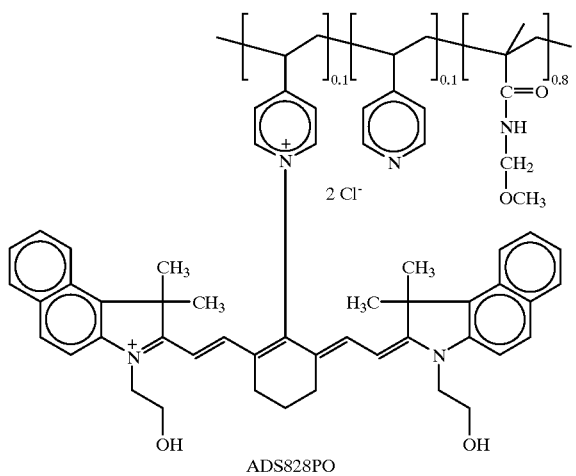

ADS828PO

EXAMPLE 3

Synthesis of Thermally Reactive Near Infrared Absorption Polymer ADS827PO.

Poly(4-vinylpyridine-co-n-butylmethacrylate-co-N-methoxymethylmethacrylamide) copolymer with 0.1 molar ratio of 4-vinylpyrridine, 0.1 molar ratio of n-butylmethacrylate and 0.8 molar ratio of N-methoxymethylmethacrylamide was synthesized by free radical polymerization. A typical polymerization was carried out by slowly dropping 100 parts of 2-methoxyethanol solution containing 7.5 parts of VAZO64 (a free radical initiator, available from Dupont) and 3 drops dodecyl mercaptan charge transfer agent (available from Aldrich Chemicals) into 320 parts of 2-methoxyethanol solution dissolving with 149.7 parts of N-methoxyethylmethacrylamide (available from Bayer), 15.15 parts of 4-vinyl pyridine and 20.50 parts of n-butylmethacrylate at 70° C. under constant stirring and nitrogen atmosphere. The reaction was continued for 10 hours to produce a viscous polymeric solution. The average molecular weight and molecular weight distribution of the obtained poly(4-vinylpyridine-co-N-methoxymethyl methacrylamide) copolymer were determined to be 43,000 and 3.2, respectively.

Thermally reactive near infrared absorption polymer ADS827PO was synthesized by slowly adding 400 parts of 2-methoxyethanol solution containing 100 parts of 2-[2-[2-choloro-3-[2-(1,3-dihydro-1-(2-hydroxyethyl)-3,3-dimethyl-2H-benz[e]indol-2-ylidene) ethylidene]-1-cyclohexene-1-yl]ethenyl]-1-(2-hydroxyethyl)-3,3-dimethyl-1H-benz[e] indolium chloride was slowly added. The reaction was continued at 40° C. under constant stirring and nitrogen atmosphere for 20 hours to produce as viscous dark green polymeric solution. Thin film of ADS827PO on glass slide shows a strong absorption band at 830 nm.

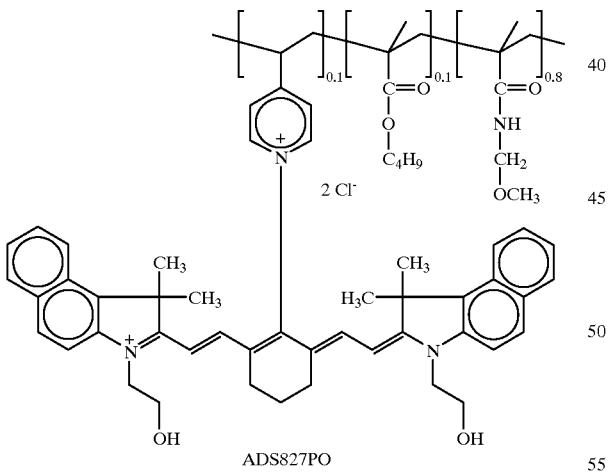

ADS827PO

EXAMPLE 4

Synthesis of Thermally Reactive Near Infrared Absorption Polymer ADS829PO

The thermally reactive near infrared absorption polymers ADS829PO was synthesized by slowly adding 400 parts of 2-methoxyethanol solution containing 90 parts of 2-[2-[2-choloro-3-[2-(1,3-dihydro-1,1,3-trimethyl-2H-benz[e]indol-2-ylidene)ethylidene]-1-cyclohexene-1-yl]ethenyl]-1,1,3-trimethyl-1H-benz[e]indolium chloride (available from American Dye Source, Inc.) and 11.6 parts of 2-chloroethanol (available from Aldrich Chemicals) into 600 parts of poly(4-vinylpyridine-co-N-methoxymethyl methacrylamide) copolymer solution, which was synthesized similarly to that obtained from Example 1. The reaction was carried out at 40° C. under nitrogen atmosphere and constant stirring for 24 hours to produce a viscous dark green polymeric solution. The thin film of ADS829PO on a glass slide shows a broad absorption band having a maximum at 829 nm.

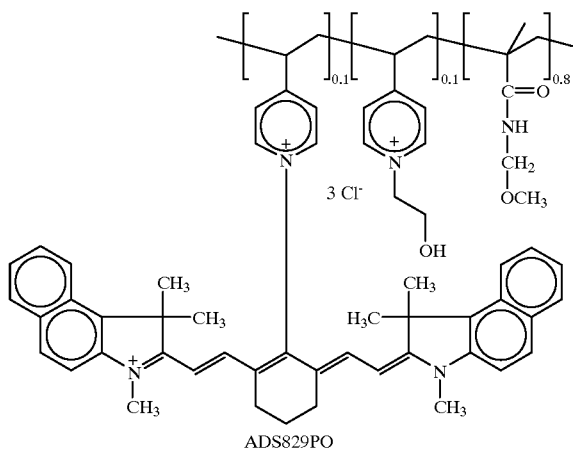

ADS829PO

EXAMPLE 5

Synthesis of Thermally Reactive Near Infrared Absorption Polymer ADS810PO

The thermally reactive near infrared absorption polymers ADS810PO was synthesized by slowly adding 420 parts of 2-methoxyethanol solution containing 80 parts of 2-[2-[2-choloro-3-[2-(1,3-dihydro-1-propyl-3,3-dimethyl-2H-indol-2-ylidene)ethylidene]-1-cyclopentene-1-yl]ethenyl]-1-propyl-3,3-trimethyl-1H-indolium chloride (available from American Dye Source, Inc.) into 600 parts of poly(4-vinylpyridine-co-N-methoxymethylmethacrylamide) copolymer solution, which was synthesized similarly to that obtained from Example 1. The reaction was carried out at 40° C. under nitrogen atmosphere and constant stirring for 20 hours to produce a viscous dark green polymeric solution. The thin film of ADS810PO on a glass slide shows a broad absorption band having a maximum at 820 nm.

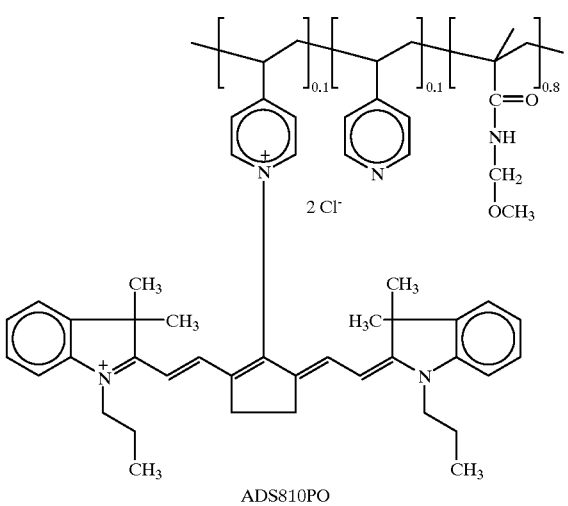

ADS810PO

EXAMPLE 6

Synthesis of Thermally Reactive Near Infrared Absorption Polymer ADS815PO

The thermally reactive near infrared absorption polymers ADS815PO was synthesized by slowly adding 410 parts of 2-methoxyethanol solution containing 87 parts of 2-[2-[2-choloro-3-[2-(3-methyl-2H-naphthothiazol-2-ylidene)ethylidene]-1-cyclohexene-1-yl]ethenyl]-3-methyl-naphthothiazolium chloride (available from American Dye Source, Inc.) into 600 parts of poly(4-vinylpyridine-co-N-methoxymethylmethacrylamide) copolymer solution, which was synthesized similarly to that obtained from Example 1. The reaction was carried out at 40° C. under nitrogen atmosphere and constant stirring for 20 hours to produce a viscous dark green polymeric solution. The thin film of ADS815PO on a glass slide shows a broad absorption band having a maximum at 820 nm.

EXAMPLE 7

Synthesis of Thermally Reactive Near Infrared Absorption Polymer ADS816PO

The thermally reactive near infrared absorption polymers ADS816PO was synthesized by slowly adding 400 parts of 2-methoxyethanol solution containing 100 parts of 2-[2-[2-choloro-3-[2-methyl-3H-naphthoselenol-2-ylidene)ethylidene]-1-cyclo hexene-1-yl]ethenyl]-3-methyinaphthoselenium chloride (available from American Dye Source, Inc.) into 600 parts of poly(4-vinylpyridine-co-N-methoxymethylmethacrylamide) copolymer solution, which was synthesized similarly to that obtained from Example 1. The reaction was carried out at 40° C. under nitrogen atmosphere and constant stirring for 20 hours to produce a viscous dark green polymeric solution. The thin film of ADS816PO on a glass slide shows a broad absorption band having a maximum at around 816 nm.

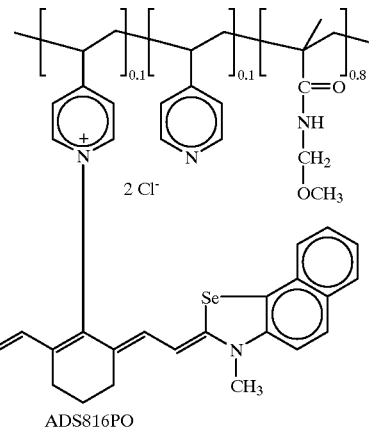

ADS816PO

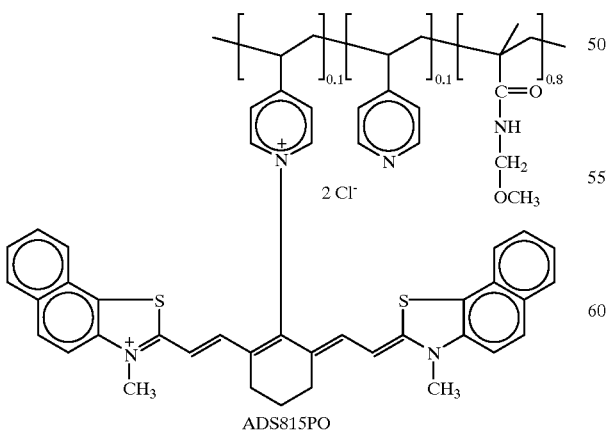

ADS815PO

EXAMPLE 8

Synthesis of Thermally Reactive Near Infrared Absorption Polymer ADS814PO

The thermally reactive near infrared absorption polymers ADS814PO was synthesized by slowly adding 420 parts of 2-methoxyethanol solution containing 82 parts of 2-[2-[2-choloro-3-[2-methyl-3H-naphthoxazol-2-ylidene)ethylidene]-1-cyclohexene-1-yl]ethenyl]-3-methylnapthoxazolium chloride (available from American Dye Source, Inc.) into 600 parts of poly(4-vinylpyridine-co-N-methoxymethylmethacrylamide) copolymer solution, which was synthesized similarly to that obtained from Example 1. The reaction was carried out at 40° C. under nitrogen atmosphere and constant stirring for 20 hours to produce a viscous dark green polymeric solution. The thin film of ADS814PO on a glass slide shows a broad absorption band having a maximum at around 814 nm.

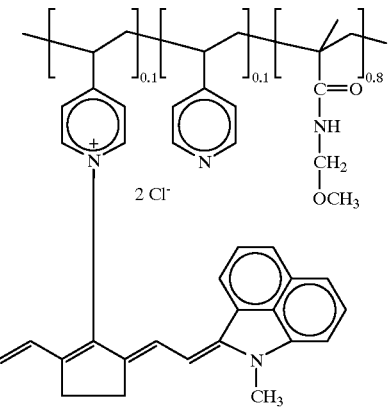

ADS1040PO

EXAMPLE 10

Synthesis of Thermally Reactive Near Infrared Absorption Polymer ADS831PO

Poly(4-vinylpyridine-co-2-hydroxyethylmethacrylate) copolymer with 0.2 molar ratio of 4-vinylpyrridine and 0.8 molar ratio of 2-hydroxyethylmethacrylate was synthesized by free radical polymerization. The synthesis was carried out by slowly adding 85 parts of 2-methoxyethanol solution containing 7.5 parts of VAZO64 (a free radical initiator, available from Dupont) and 3 drops dodecyl mercaptan (charge transfer agent, available from Aldrich Chemicals) into 300 parts of 2-methoxyethanol solution dissolving with 134.7 g 2-hydroxyethylmethacrylate (available from Aldrich Chemicals), 30.3 parts of 4-vinyl pyridine at 70° C. under constant stirring. The reaction was continued for 10 hours to produce a viscous polymeric solution having 30 percent solid weight. The average molecular weight and molecular weight distribution of the obtained poly(4-vinylpyridine-co-2-hydroxyethylmethacrylate) copolymer were determined to be 37,000 and 2.8, respectively.

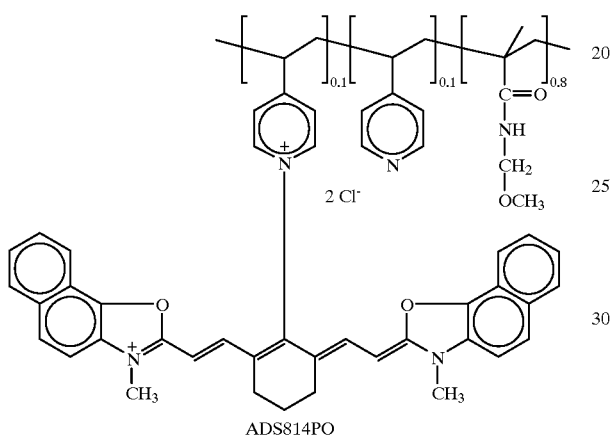

ADS814PO

EXAMPLE 9

Synthesis of Thermally Reactive Near Infrared Absorption Polymer ADS1040PO

The thermally reactive near infrared absorption polymers ADS1040PO was synthesized by slowly adding 400 parts of 2-methoxyethanol solution containing 75 parts of methyl-2-[2-[3-[(1-methylbenz[cd]indol-2(1H)-ylidene) ethylidene]-2-cyclopentene-1-yl]ethenyl]benz[cd]indolium chloride (available from American Dye Source, Inc.) into 600 parts of poly(4-vinylpyridine-co-N-methoxymethylmethacrylamide) copolymer solution, which was synthesized similarly to that obtained from Example 1. The reaction was carried out at 40° C. under nitrogen atmosphere and constant stirring for 20 hours to produce a viscous brownish polymeric solution. The thin film of ADS1040PO on a glass slide shows a broad absorption band having a maximum at around 1052 nm.

The thermally reactive near infrared absorption polymers ADS831PO was synthesized by slowly adding 410 parts of 2-methoxyethanol solution containing 90 parts of 2-[2-[2-choloro-3-[2-(1,3-dihydro-1,1,3-trimethyl-2H-benz[e] indol-2-ylidene)ethylidene]-1-cyclohexene-1-yl]ethenyl]-1,1,3-trimethyl-1H-benz[e] indolium chloride (available from American Dye Source, Inc.) and 11.6 parts of 2-chloroethanol (available from Aldrich Chemicals) into 550 parts of poly(4-vinylpyridine-co-2-hydroxyethylmethacrylate) copolymer solution. The reaction was carried out at 40° C. under nitrogen atmosphere and constant stirring for 20 hours to produce a viscous dark green polymeric solution. The thin film of ADS831PO on a glass slide shows a broad absorption band having a maximum at around 829 nm.

20 hours to produce a viscous dark green solution having the following structure ADS821PO. Thin film of ADS821PO on polyester film exhibits a broad absorption band having a maximum at around 836 nm.

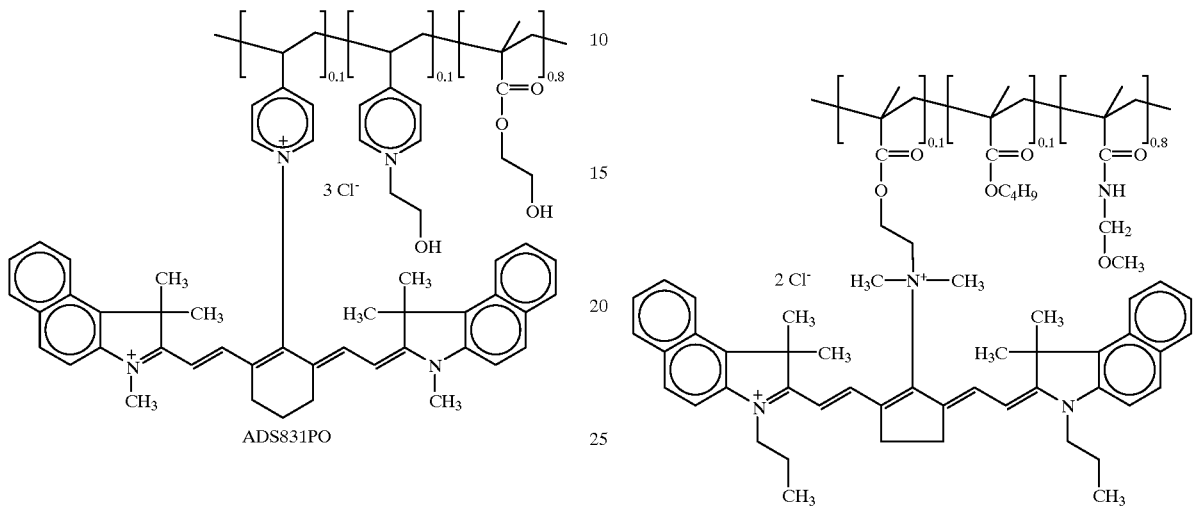

ADS831PO

ADS821PO

EXAMPLE 11

Synthesis of Thermally Reactive Near Infrared Absorption Polymer ADS821PO

Poly(2-dimethyl-aminoethyl-methacrylate-co-n-butyl-methacrylate-co-N-methoxymethyl methacryl-amide) copolymer with 0.1 molar ratio of 2-dimethyl aminoethyl methacrylate, 0.1 molar ratio of n-butylmethacrylate and 0.8 molar ratio of N-methoxymethylmethacrylamide was synthesized by free radical polymerization. The polymerization was carried out by slowly dropping 100 parts of 2methoxyethanol solution containing 7.5 parts of VAZO64 (a free radical initiator, available from Dupont) and 3 drops dodecyl mercaptan charge transfer agent (available from Aldrich Chemicals) into 320 parts of 2-methoxyethanol solution dissolving with 149.7 parts of N-methoxyethylmethacrylamide (available from Bayer), 15.15 parts of 2-dimethylaminoethyl methacrylate and 20.50 parts of n-butylmethacrylate at 70° C. under constant stirring. The reaction was continued for 10 hours to produce a viscous polymeric solution. The average molecular weight and molecular weight distribution of the obtained Poly(2-dimethyl aminoethyl methacrylate-co-n-butyl methacrylate-co-N-methoxymethyl methacryl-amide) copolymer were determined to be 43,000 and 3.2, respectively.

Thermally reactive near infrared absorption polymers ADS821PO was synthesized by slowly adding 400 parts of methoxyethoxyethanol solution containing 62 parts of 2-[2-[2-choloro-3-[2-(1,3-dihydro-1,1,3-trimethyl-2H-benz[e]indol-2-ylidene)ethylidene]-1-cyclopentene-1-yl]-ethenyl]-1,1,3-trimethyl-1H-benz[e]indolium chloride (available from American Dye Source, Inc.) into 600 parts Poly(2-dimethyl aminoethyl methacrylate-co-n-butyl methacrylate-co-N-methoxymethyl methacryl-amide) copolymer solution at 40° C. under nitrogen atmosphere and constant stirring. The mixture was continued to stir at the above condition for

EXAMPLE 12

Synthesis of Thermally Reactive Near Infrared Absorption Polymer ADS815PO

Two hundred parts of butylated phenolic resin (available from Georgia Pacific) was dissolved in 600 parts of N,N-dimethyl formamide. The polymer solution was heated to 40° C. under constant stirring and nitrogen atmosphere. One part of sodium hydride powder (60% in mineral oil, available from Aldrich Chemicals) was slowly added into the polymer solution. The mixture was stirred at 40° C. until hydrogen gas bubble disappearing. A solution containing 100 parts of N,N-dimethyl formamide dissolving with 18.7 parts of 2-[2-[2-choloro-3-[2-(1,3-dihydro-1,1,3-trimethyl-2H-benz[e]indol-2-ylidene)ethylidene]-1-cyclohexene-1-yl]ethenyl]-1,1,3-trimethyl-1H-benz [e]indolium 4-methylbenzenesulfonate (available from American Dye Source, Inc.) was slowly into the polymer mixture and the reaction was continued for 5 hours. Then, twenty parts of n-iodobutane was added and the reaction was continued at the above conditions for 20 hours. The product was precipitated in water, collected by vacuum filtration, washed copiously with water and then dried in air until constant weight. The film of near infrared absorption polymer ADS815PO shows a broad absorption band having a maximum at around 815 nm.

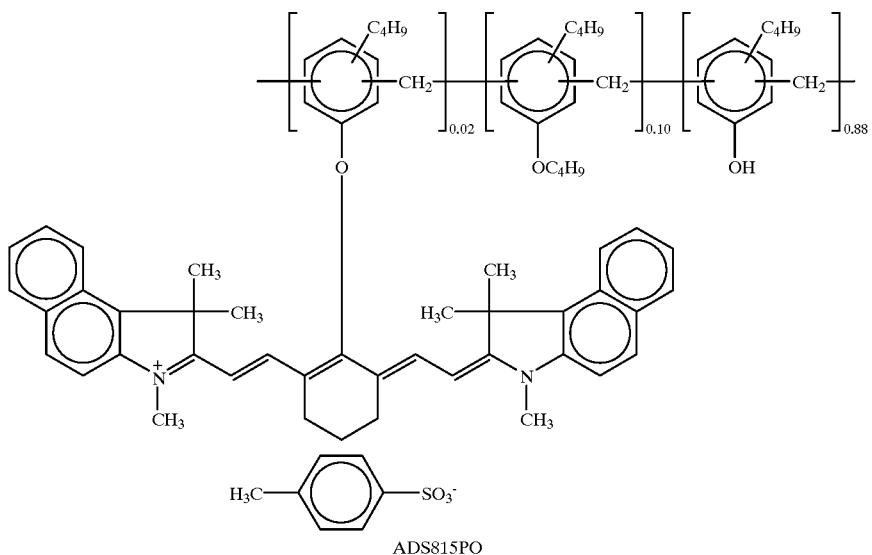

ADS815PO

EXAMPLE 13

Synthesis of Thermally Reactive Near Infrared Absorption Dye ADS807PO

Two hundred parts of poly(4-hydroxystyrene-co-2-hydroxyethylmethacrylate) resin (available from SiberHegner America) was dissolved in 600 grams N,N-dimethyl formamide. The polymer solution was heated to 40° C. under constant stirring and nitrogen atmosphere. One part of sodium hydride powder (60% in mineral oil, available from Aldrich Chemicals) was slowly added into the polymer solution. The mixture was stirred at 40° C. until hydrogen gas bubble disappearing. A solution containing 100 parts of N,N-dimethyl formamide dissolving with 16 parts of 2-[2-[2-choloro-3-[2-(1,3-dihydro-1-1,3-trimethyl-2H-benz[e]indol-2-ylidene)ethylidene]-1-cyclohexene-1-yl]ethenyl]-1,1,3-trimethyl-1H-benz[e]indolium 4-methylbenzene sulfonate (available from American Dye Source, Inc.) was slowly into the polymer mixture. The reaction was continued at the above conditions for 12 hours. The near infrared polymer dye ADS805PO was precipitated in water, collected by vacuum filtration, washed copiously with ether and then dried in air until constant weight. The film of near infrared absorption polymer ADS807PO shows a broad absorption band having a maximum at around 824 nm.

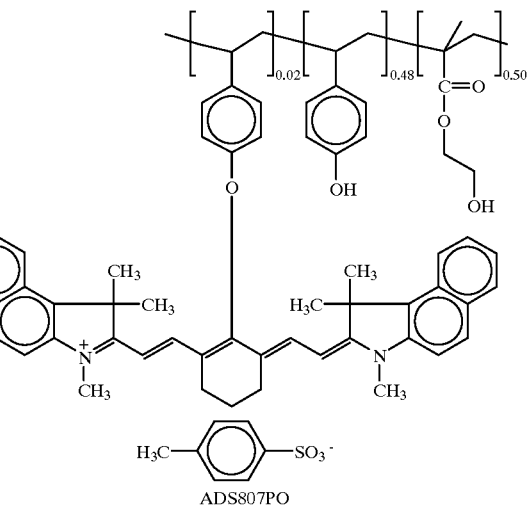

ADS807PO

EXAMPLE 14

Synthesis of Thermally Reactive Near Infrared Absorption Dye ADS805PO

Two hundred parts of poly(4-hydroxystyrene-co-2-hydroxyethylmethacrylate) resin (available from SiberHegner America) was dissolved in 600 grams N,N-dimethyl formamide. The polymer solution was heated to 40° C. under constant stirring and nitrogen atmosphere. One part of sodium hydride powder (60% in mineral oil, available from Aldrich Chemicals) was slowly added into the polymer solution. The mixture was stirred at 40° C. until hydrogen gas bubble disappearing. A solution containing 100 parts of N,N-dimethyl formamide dissolving with 18.7 parts of 2-[2-[2-choloro-3-[2-(1,3-dihydro-1-(4-sulfobutyl)-1,3-diimethyl-2H-benz[e]indol-2-ylidene)ethylidene]-1-cyclohexene-1-yl]ethenyl]-1-(4-sulfobutyl)-1,3-dimethyl- 1H-benz[e]indolium inner salt, free acid (available from American Dye Source, Inc.) was slowly into the polymer mixture. The reaction was continued at the above conditions for 12 hours. The near infrared polymer dye ADS805PO was precipitated in ether, collected by vacuum filtration, washed copiously with ether and then dried in air until constant weight. The film of near infrared absorption polymer ADS805PO shows a broad absorption band having a maximum at around 827 nm.

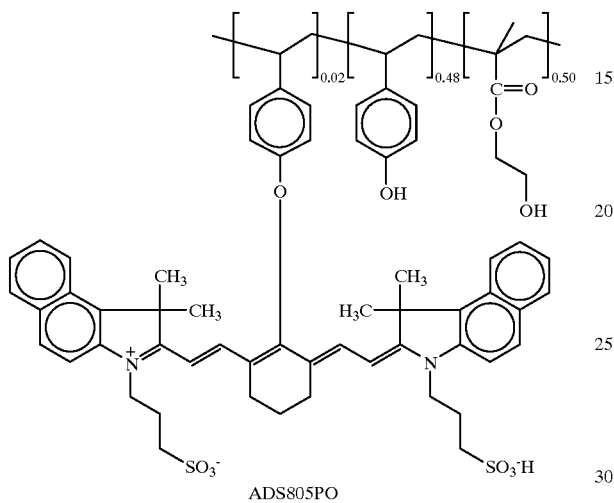

ADS805PO

EXAMPLE 15

Synthesis of Near Infrared Absorption polymer ADS819PO

The near infrared absorption polymer ADS819PO was prepared by dissolving 47.2 parts of Novolak resin (SD140A, Available from Borden Chemical) in 400 parts of N,N-dimethyl formamide. To the solution mixture, 0.2 parts of sodium hydride (60% in mineral oil, available from Aldrich Chemicals) was slowly added at 60° C. under constant stirring and nitrogen atmosphere. The reaction was stirred for 60 minutes. To the reaction mixture, 100 parts of N,N-dimethylformamide dissolved with 4 parts of 2-[2-[2-choloro-3-[2-(1,3-dihydro-1,1,3-trimethyl-2H-benz[e]indol-2-ylidene)ethylidene]-1-cyclohexene-1-yl]ethenyl]-1,1,3-trimethyl-1H-benz[e]indolium 4-methylbenzenesufonate (available from American Dye Source) was slowly added. The reaction was continued to stir at 60° C. under nitrogen atmosphere for 4 hours. The reaction was cooled to room temperature and the product was precipitated in water. The dark green near infrared absorption polymer ADS819PO was collected by vacuum filtration, washed with water and dried in air until constant weight. The thin film of near infrared absorption polymer ADS819PO coated on polyester film exhibits a strong absorption band having a maximum at around 825 nm.

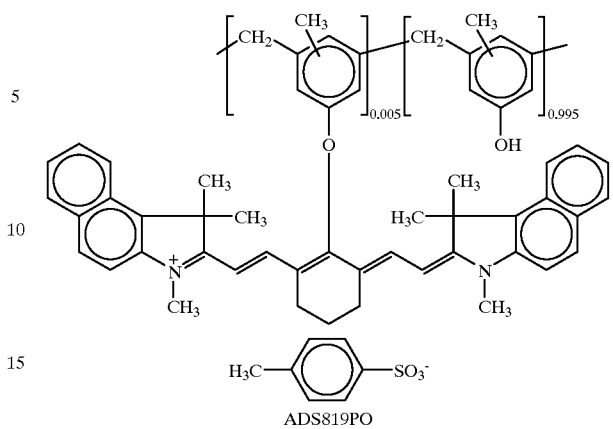

ADS819PO

PREPARATION OF LITHOGRAPHIC PRINTING PLATES

EXAMPLE 16

Preparation of Non-process Thermal Printing Plate

The coating solution was prepared by dissolving 30.0 parts of ADS830PO polymer solution from Example 1 and 5.0 parts of ADS815PO from Example 12 into a solvent mixture containing 50 parts of methanol, 20 parts of methyl ethyl ketone and 20 parts 2-methoxyethanol. The solution was spin coated on the hydrophilic polyester film (Omega Plus, available from Autotype Inc.) at 80 rpm and dried with hot air for 5 minutes to produce a uniform green polymeric coating having a coating weight between 1.5 and 2.0 g/m$^2$. The plate was imaged on the Creo Trendsetter, which was equipped with array of 830 nm solid state diode laser at energy density between 400 and 600 mJ/cm$^2$. The imaged plate was mounted on AB Dick press using the conventional black ink and fountain solution. High resolution and clean printed copies were obtained after about 30 rolling up revolution. The plate produced more than 25,000 copies without deterioration.

EXAMPLE 17

Preparation of Non-Process Thermal Printing Plate

The coating solution was prepared by dissolving 30 parts of ADS828PO (from example 2) and 5 parts of ADS815PO (from Example 12) in a solvent mixture containing 50 parts of methanol, 20 parts of methyl ethyl ketone and 20 parts of 2-methoxyethanol. The solution was spin coated on a hydrophilic surface treated polyester substrate (Omega Plus, available from Autotype) at the speed of 80 rpm and dried at 80° C. for five minutes to produce a uniform film having a coating weight of 2 g/m$^2$. The plate was imaged with a Creo Trendsetter image setter at energy density between 400 and 550 mJ/cm$^2$. The imaged plate was mounted on an AB Dick duplicator press. After 30 revolution rolling up, the plate produced high resolution printing image with clean background. The plate produced more than 25,000 copies without deterioration.

EXAMPLE 18

Preparation of Positive Thermal Printing Plate

The coating solution was prepared by dissolving 10 parts of ADS819PO (from Example 14) in 90 parts of solvent system containing 30 parts methanol, 30 parts methyl ethyl ketone and 30 parts of 2-methoxyethanol. The solution was filtered to remove any solid particles. It was spin coated on an electrolytic grained aluminum substrate, which was treated with polyvinyl phosphoric acid, at a speed of 80 rpm and dried at 80° C. for 5 minutes. The plate was imaged with a Creo Trendsetter image setter at the energy between 160 and 300 mJ/cm$^2$. The exposed area of the imaged plate was developed with a positive aqueous developer (P3000, available from Polychrome Corporation) to produce a high resolution printing plate. The plate was baked at 200° C. for 2 minutes. It was mounted on an AB Dick duplicator press to produce more than 100,000 copies without deterioration.

EXAMPLE 19

Preparation of Negative Thermal Printing Plate.

The coating solution was prepared by dissolving 8 parts of ADS828PO (from Example 2), 8 parts of ADS807PO (from Example 13) and 2 parts of onium salt (CD1012, available from Sartomer) in a solvent mixture containing 40 parts of methanol, 20 parts of methyl ethyl ketone and 30 parts of 2-methoxy ethanol. The solution was filtered to remove any solid particles. It was spin coated on an electrolytic grained aluminum substrate, which was previously treated with polyvinyl phosphoric acid, at a speed of 80 rpm and dried at 80° C. for 5 minutes. The plate was imaged with a Creo Trendsetter image setter at the energy between 120 and 250 mJ/cm$^2$. The imaged plate was heated at 125° C. for 1.5 minutes to promote the crosslink reactions. It was then developed with an aqueous developer to produce a high resolution negative image. The plate was baked at 200° C. for 2 minutes. It was mounted on an AB Dick duplicator press to produce more than 100,000 copies without deterioration.

EXAMPLE 20

Preparation of Negative Thermal Printing Plate.

The coating solution was prepared by dissolving 50 parts of polymethylmethacrylate emulsion (20% in water, available from American Dye Source, Inc.) and 20 parts of ADS830PO (from Example 1) in 50 parts of water. The solution was spin coated on an electrolytic grained aluminum substrate, which was previously treated with polyvinyl phosphoric acid, at a speed of 80 rpm and dried with hot air for 5 minutes to produce a uniform green coating having a coating weight between 1.5 and 2.0 g/m$^2$. The plate was imaged with a Creo Trendsetter image setter at the energy between 120 and 250 mJ/cm$^2$. The unexposed area was removed with a negative aqueous developer having a pH between 9 and 11 to produce a high resolution negative image. The plate was baked at 200° C. for 2 minutes. It was mounted on an AB Dick duplicator press to produce more than 100,000 copies without deterioration.

EXAMPLE 21

Preparation of Negative Thermal Printing Plate.

The coating solution was prepared by dissolving 50 parts of poly(methylmethacrylate-co-N-methoxymethylmethacrylamide) emulsion (20% in water, available from American Dye Source, Inc.) and 20 parts of ADS831PO (from Example 10) in 100 parts of water. The solution was spin coated on an electrolytic grained aluminum substrate, which was previously treated with polyvinyl phosphoric acid, at a speed of 80 rpm and dried at 80° C. for 5 minutes to produce a green uniform coating having a coating weight between 1.5 and 2.0 g/m$^2$. The plate was imaged with a Creo Trendsetter image setter at the energy between 150 and 250 mJ/cm$^2$. The unexposed area was removed with a negative aqueous developer having a pH between 9 and 11 to produce a high resolution negative image. The plate was baked at 200° C. for 2 minutes and mounted on an AB Dick duplicator press to produce more than 100,000 copies without deterioration.

EXAMPLE 22

Preparation of Negative Thermal Printing Plate.

The coating solution was prepared by dissolving 50 parts of poly(methylmethacrylate-co-2-hydroxyethylmethacrylate) emulsion (20% in water, available from American Dye Source, Inc.) and 20 parts of ADS828PO (from Example 2) in 100 parts of water. The solution was spin coated on an electrolytic grained aluminum substrate, which was previously treated with polyvinyl phosphoric acid, at a speed of 80 rpm and dried at 80° C. for 5 minutes to produce a green uniform coating having a coating weight between 1.5 and 2.0 g/m$^2$. The plate was imaged with a Creo Trendsetter image setter at the energy between 150 and 250 mJ/cm$^2$. The unexposed area was removed with a negative aqueous developer having a pH between 9 and 11 to produce a high resolution negative image. The plate was baked at 200° C. for 2 minutes and mounted on an AB Dick duplicator press to produce more than 100,000 copies without deterioration.

EXAMPLE 23

Preparation of Printed Circuit Board.

The coating solution was prepared by dissolving 8 parts of ADS829PO (from Example 4), 8 parts of ADS807PO (from Example 13) and 2 part of onium salt (CD1012, available from Sartomer) in a solvent mixture containing 40 parts of methanol, 20 parts of methyl ethyl ketone and 30 parts of 2-methoxy ethanol. The solution was filtered to remove any solid particles. It was spin coated on a laminated copper board (available from Active Electronics) at a speed of 80 rpm and dried at 80° C. for 5 minutes. The circuit was draw with a home-built flat-bed image setter equipped with 830 nm solid state diode laser (available from Optopower) at an energy density of 250 mJ/cm$^2$. The imaged board was heated at 125° C. for 2 minutes to promote the crosslink reactions at the exposed area. The unexposed area was removed with an aqueous developer and rinsed well with water. The copper area that is not covered by the coating was etched away using ferric chloride etching solution (available from MG Chemicals), and rinsed well with water. Finally, the polymeric mask was removed using alcohol solution to produce a sharp printed circuit board.

EXAMPLE 24

Preparation of Chemical Sensor

The printed circuit board having two opposite comb sharp circuitry was prepared similarly to that obtained from example 23. The two opposite comb sharp circuitry have the teeth with the width of 1.0 mm and 0.5 mm apart. They were used as electrodes for measurement the conductivity. To obtain a typical chemical sensor, a solution containing 1-methyl-2-pyrrolidinone and polyaniline (available from American Dye Source, Inc.) was spin coated on these electrodes and dried at 70° C. for 12 hours to produce a uniform thin blue polymeric film having a thickness around 3 μm. The sensor was exposed to the vapor of hydrochloride acid and the conductivity was measured to be 1.2 S/cm$^2$. The sensor was then exposed to the vapor of ammonia vapor. The conductivity was dropped to $1.0 \times 10^{-8}$ S/cm$^2$.

Although the invention has been described above with respect with one specific form, it will be evident to a person skilled in the art that it may be modified and refined in various ways. It is therefore wished to have it understood that the present invention should not be limited in scope, except by the terms of the following claims.

I claim:

1. A lithographic printing plate consisting of a substrate plate comprising a coating of a near infrared absorption polymer comprising the following repeating units:

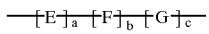

wherein

E represents the near infrared absorption segment, which exhibits strong absorption bands between 780 and 1200 nm;

F represents the processing segment, which provides excellent film forming properties and solubility in aqueous solutions having pH between 2.0 and 14.0;

G represents the thermally reactive segment, which undergoes localized chemical or physical reactions, with or without catalysts, upon localized exposure to near infrared laser light so that said polymer becomes locally:
  (i) insoluble in aqueous solutions if said polymer was soluble in aqueous solutions prior to exposure to near infrared light, or
  (ii) soluble in aqueous solutions if said polymer was insoluble in aqueous solutions prior to exposure to near infrared light;

a, b and c represent the molar ratios, which vary from 0.01 to 1.00; and wherein said polymer has a molecular weight greater than about 5,000.

2. The lithographic printing plate of claim 1 wherein the polymer coating further comprises in mixture therewith binder resins and film forming additives and wherein the polymer coating is applied on a heat insulating hydrophilic underlayer itself coated on the substrate.

3. A lithographic printing plate consisting of a substrate plate comprising a coating of a polymer of claim 1 according to Formula II:

Formula II

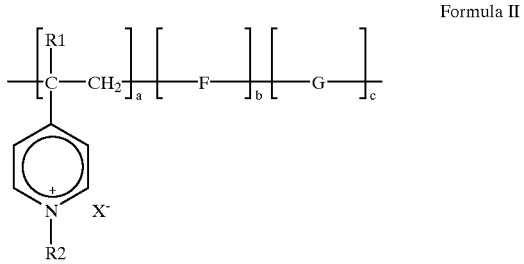

wherein

F represents the processing segment selected from alkyl acrylate, alkyl methacrylate, hydroxy alkyl acrylate, hydroxy alkyl methacrylate, methyl acrylic acid, methyl methacrylic acid, hydroxy phenyl, hydroxy styrene, sulfoalkyl acrylic acid, sulfoalkyl methacrylic acid, sulfoalkyl acrylic acid metal salts, sulfoalkyl methacrylic acid metal salts, vinyl pyridine, vinyl alkyl pyridium salts, dialkylamino acrylate, and dialkylamino methacrylate;

G represents the thermally reactive unit, which is selected from hydroxy alkyl acrylate, hydroxy alkyl methacrylate, hydroxy styrene, amino styrene, N-alkoxymethyl acrylamide, N-alkoxymethyl methacrylamide, glycidyl alkyl acrylate, and glycidyl alkyl methacrylate;

X represents an anionic counter ion selected from bromide, chloride, iodide, tosylate, triflate, trifluoromethane carbonate, dodecyl benzosylfonate and tetrafluoroborate;

R1 is hydrogen or alkyl with 1 to 18 carbon atoms;

R2 is near infrared absorption chromophoric moiety comprising derivatives of indole, benz indole, benz indole, benzothiazole, napthothiazole, benzoxazole, napthoxazole, benzselenazole, and napthoselenazole, which can be represented according to Formula VI:

Formula VI

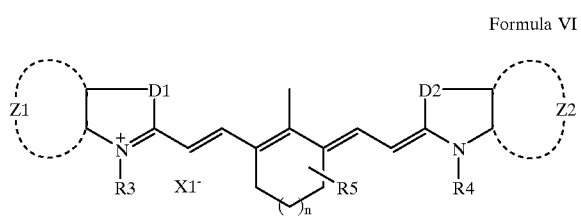

wherein

Z1 and Z2 represent sufficient atoms to form a fused substituted or unsubstituted aromatic rings, such as phenyl and naphthyl;

D1 and D2 represent —O—, —S—, —Se—, —CH=CH—, and —C(CH$_3$)$_2$—;

R3 and R4 represent alkyl, aryl alkyl, hydroxy alkyl, amino alkyl, carboxy alkyl, sulfo alkyl;

R5 represents alkyl and aryl substitution;

X1 represents an anionic counter ion selected from bromide, chloride, iodide, tosylate, triflate, trifluoromethane carbonate, dodecyl benzosylfonate and tetrafluoroborate;

n represents 0 or 1.

4. The lithographic printing plate of claim 3 wherein the polymer coating further comprises in mixture therewith binder resins and film forming additives and wherein the polymer coating is applied on a heat insulating hydrophilic underlayer itself coated on the substrate.

5. A lithographic printing plate consisting of a substrate plate comprising a coating of a polymer a polymer according to Formula III:

Formula III

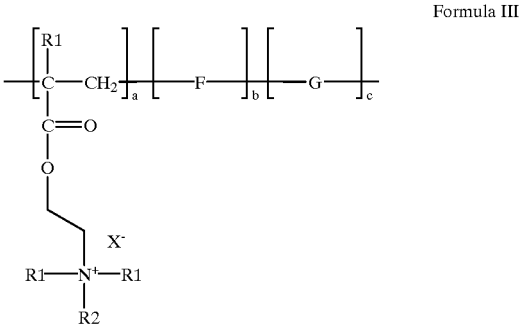

wherein F. G. X, R1 and R2 are as defined in claim 3.

6. The lithographic printing plate of claim 5 wherein the polymer coating further comprises in mixture therewith binder resins and film forming additives and wherein the polymer coating is applied on a heat insulating hydrophilic underlayer itself coated on the substrate.

7. A lithographic printing plate consisting of a substrate plate comprising a coating of a polymer according to Formula IV:

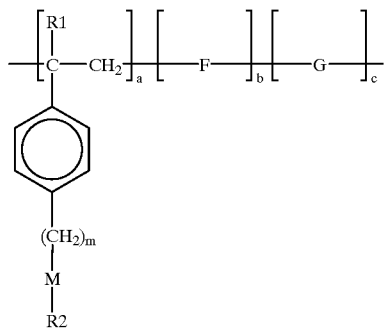

Formula IV wherein F, G, X, R1 and R2 are as defined in claim 3 and wherein

M represents oxygen, sulfur, dialkyl amine, and m represents number of repeating units which varies from 0 to 5.

8. The lithographic printing plate of claim 7 wherein the polymer coating further comprises in mixture therewith binder resins and film forming additives and wherein the polymer coating is applied on a heat insulating hydrophilic underlayer itself coated on the substrate.

9. A lithographic printing plate consisting of a substrate plate comprising a coating of a polymer according to Formula V:

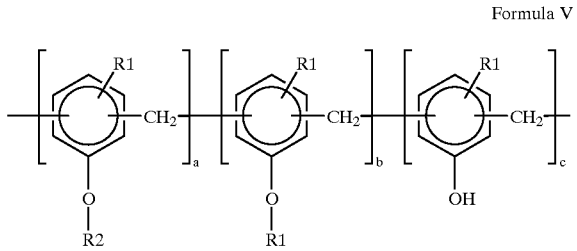

Formula V wherein R1 and R2 are as defined in claim 3.

10. The lithographic printing plate of claim 9 wherein the polymer coating further comprises in mixture therewith binder resins and film forming additives and wherein the polymer coating is applied on a heat insulating hydrophilic underlayer itself coated on the substrate.

11. A method of preparing a wet-chemical development free lithographic printing plate having a substrate selected from the group of materials consisting of paper, cardboard, plastic, composites and metal, said method comprising the steps of:

(a) coating a hydrophilic and heat insulating underlayer on said substrate;

(b) coating thereon the polymer defined in claim 1 mixed with at least one binder resin and film forming additive;

(c) drawing a digital image on the coating of step (b) by exposing said coating to pulse of a near-infrared computer guided laser thereby eliciting a localized reaction in said polymer coating of step (b) rendering it hydrophilic in its region exposed to the laser pulse;

(d) washing away said hydrophilic region with water or an aqueous solution.

12. A method of preparing a printed circuit board prototype having a substrate selected from the group of materials consisting of paper, cardboard, plastic, composites and metal, said method comprising the steps of:

(a) coating a conductive and heat insulating underlayer on said substrate;

(b) coating thereon the polymer defined in claim 1 mixed with at least one binder resin and film forming additive;

(c) drawing a circuit map on the coating of step (b) by exposing said coating to pulse of a near-infrared computer guided laser thereby eliciting a localized reaction in said polymer coating of step (b) rendering it hydrophilic in its region exposed to the laser pulse;

(d) washing away said hydrophilic region with water or an aqueous solution thereby exposing a conductive circuit map.

* * * * *